(12) United States Patent
Iwazaki et al.

(10) Patent No.: US 11,729,885 B2
(45) Date of Patent: Aug. 15, 2023

(54) LIGHT-EMITTING ELEMENT DRIVING CIRCUIT

(71) Applicant: HAMAMATSU PHOTONICS K.K., Hamamatsu (JP)

(72) Inventors: Yuya Iwazaki, Hamamatsu (JP); Sena Tsutsumi, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 17/637,487

(22) PCT Filed: Oct. 22, 2020

(86) PCT No.: PCT/JP2020/039685
§ 371 (c)(1),
(2) Date: Feb. 23, 2022

(87) PCT Pub. No.: WO2021/085292
PCT Pub. Date: May 6, 2021

(65) Prior Publication Data
US 2022/0279638 A1    Sep. 1, 2022

(30) Foreign Application Priority Data
Oct. 31, 2019   (JP) .................. 2019-198559

(51) Int. Cl.
  *H05B 45/46*   (2020.01)
  *H05B 45/52*   (2020.01)
  *H01S 5/02*    (2006.01)
(52) U.S. Cl.
  CPC ............ *H05B 45/46* (2020.01); *H05B 45/52* (2020.01)
(58) Field of Classification Search
  None
  See application file for complete search history.

(56) References Cited

U.S. PATENT DOCUMENTS

2006/0133435 A1   6/2006   Ikeda
2009/0187925 A1   7/2009   Hu et al.
(Continued)

FOREIGN PATENT DOCUMENTS

JP   S51-147983 A   12/1976
JP   H09-270554 A   10/1997
(Continued)

OTHER PUBLICATIONS

English-language translation of International Preliminary Report on Patentability (IPRP) dated May 12, 2022 that issued in WO Patent Application No. PCT/JP2020/039685.

*Primary Examiner* — Dedei K Hammond
(74) *Attorney, Agent, or Firm* — Faegre Drinker Biddle & Reath LLP

(57) ABSTRACT

The present disclosure relates to a driving circuit individually performing drive control of light-emitting elements having cathodes with the same potential. The driving circuit includes driving circuit units provided in one-to-one correspondence with the light-emitting elements. Each driving circuit unit includes a switching element, a first energy-storage element, a current-control element, and a current-interrupting element. The current-control element connects in parallel to the semiconductor light-emitting element. In the first energy-storage element, a first electrode connects to a first node, and a second electrode connects to a first constant-potential line. In the switching element, a first current terminal connects to a second electrode, and a second current terminal connects to a second node. The second nodes connect to the second constant-potential line without short-circuiting each other by the current-interrupting element. The current-interrupting element interrupts or suppresses current during a period in which the switching element is in ON-state.

7 Claims, 14 Drawing Sheets

(56) References Cited

U.S. PATENT DOCUMENTS

| | | | |
|---|---|---|---|
| 2013/0187561 A1* | 7/2013 | Franck | H05B 45/46 |
| | | | 315/201 |
| 2016/0191196 A1 | 6/2016 | Troiani et al. | |
| 2017/0085057 A1 | 3/2017 | Barnes et al. | |
| 2018/0278017 A1 | 9/2018 | Mignoli et al. | |

FOREIGN PATENT DOCUMENTS

| | | | | |
|---|---|---|---|---|
| JP | 2002-288864 A | 10/2002 | | |
| JP | 2002-335038 A | 11/2002 | | |
| JP | 2005-340774 A | 12/2005 | | |
| JP | 2011-199220 A | 10/2011 | | |
| JP | 2019-068528 A | 4/2019 | | |
| JP | 2019-135740 A | 8/2019 | | |
| JP | 2019135740 A | * 8/2019 | | H01S 5/042 |
| KR | 10-2015-0141396 | 12/2015 | | |

\* cited by examiner

LIGHT-EMITTING ELEMENT DRIVING CIRCUIT

TECHNICAL FIELD

The present disclosure relates to a light-emitting element driving circuit.

BACKGROUND ART

Patent Document 1 discloses a technique related to a current generation circuit for an array element. This circuit includes one reference voltage input and transistors each a constituting constant current generation circuit for an associated channel. The reference voltage input is connected to respective bases of the transistors via passive circuitry. The respective emitters of the transistors are connected to a common ground line via resistors. The respective constant current generation circuits in the channels are intensively disposed in a specific region on an integrated circuit chip. The respective collector output currents of the transistors are individually supplied to array functional circuit blocks distributed in the integrated circuit chip.

Patent Document 2 discloses a technique related to a light source device of an optical head. The device includes a common package, a single-mode oscillating semiconductor laser and a multi-mode oscillating semiconductor laser incorporated in the package, and a high-frequency oscillation circuit. The high-frequency oscillation circuit generates a high-frequency current to be superimposed on a driving current of the semiconductor laser in order to convert the single-mode oscillating semiconductor laser into multi-mode oscillation. This device has means for preventing unnecessary radiation due to a high-frequency current. This means includes a high-frequency component absorber circuit provided in a feed line of the multi-mode oscillating semiconductor laser. The high-frequency component absorber circuit is a band pass filter, a choke coil, or a ferrite bead.

CITATION LIST

Patent Literatures

Patent Document 1: Japanese Patent Application Laid-Open No. H9-270554
Patent Document 2: Japanese Patent Application Laid-Open No. 2002-288864

SUMMARY OF INVENTION

Technical Problem

As a result of studying the above-described conventional techniques, the inventors have found a problem described below. That is, when a plurality of semiconductor light-emitting elements are individually driven, independent driving circuit units are usually used for the associated semiconductor light-emitting elements. However, for example, in a plurality of semiconductor light-emitting elements monolithically integrated on a common substrate, the cathodes may be set to the same potential (a configuration in which the respective cathodes of the semiconductor light-emitting elements are connected to a common line). In such a case, the plurality of driving circuit units are short-circuited to each other via the common line. Thus, if the semiconductor light-emitting elements are individually driven, it is necessary to arrange a contrivance to prevent the driving current from flowing to the other semiconductor light-emitting elements via the common line.

The present disclosure has been made to solve the above-described problems, and an object of the present disclosure is to provide a light-emitting element driving circuit having a structure for individually pulse-driving a plurality of semiconductor light-emitting elements each having a cathode, the cathodes of the plurality of semiconductor light-emitting elements being electrically connected to each other via a common line.

Solution to Problem

A light-emitting element driving circuit according to the present embodiment is a circuit configured to individually perform drive control of a plurality of semiconductor light-emitting elements, and includes a plurality of driving circuit units associated one-to-one with the plurality of semiconductor light-emitting elements. The cathodes of the plurality of semiconductor light-emitting elements may be unified as a cathode electrode by a monolithic structure, or may be electrically connected via a common line and/or a common terminal. As a result, the cathodes of the plurality of semiconductor light-emitting elements are set to the same potential. The plurality of driving circuit units individually pulse-drives the associated semiconductor light-emitting elements. Each of the plurality of driving circuit units includes a current control element, a first energy storage element, and a switching device. The current control element has a first terminal electrically connected to the cathode of the associated semiconductor light-emitting element via a first node, and a second terminal electrically connected to an anode of the associated semiconductor light-emitting element via a second node. The current control element causes current to flow from the first node to the second node while the associated semiconductor light-emitting element is in the non-light-emitting state, and limits the current while the associated semiconductor light-emitting element is in the light-emitting state. The first energy storage element includes a first electrode electrically connected to the first node and a second electrode. The switching element includes a control terminal to which a control signal for driving the associated semiconductor light-emitting element is inputted, a first current terminal electrically connected to the second electrode of the first energy storage element, and a second current terminal electrically connected to the second node.

Further, in the light-emitting element driving circuit, each of second electrodes of the first energy storage elements in the plurality of driving circuit units is electrically connected to a first constant potential line. Each of second nodes in the plurality of driving circuit units is electrically connected to a second constant potential line via a first current interrupting element or directly. However, the first current interrupting element is disposed on the line between two adjacent second nodes and avoids a short circuit between the two adjacent second nodes. The second constant potential line is set to a lower potential than the first constant potential line. The control target of the first current interrupting element is at least a current with a specific frequency or a current in a specific period. The first current interrupting element interrupts or suppresses the control target. The first current interrupting element interrupts or suppresses current at least during a period in which the switching element is in an ON-state.

Advantageous Effects of Invention

According to the present disclosure, it is possible to provide a light-emitting element driving circuit capable of individually driving a plurality of semiconductor light-emitting elements each having a cathode, set potentials of the cathodes of the semiconductor light-emitting elements being equal to each other.

DESCRIPTION OF EMBODIMENTS

Description of Embodiments of Present Invention

Figure 1:
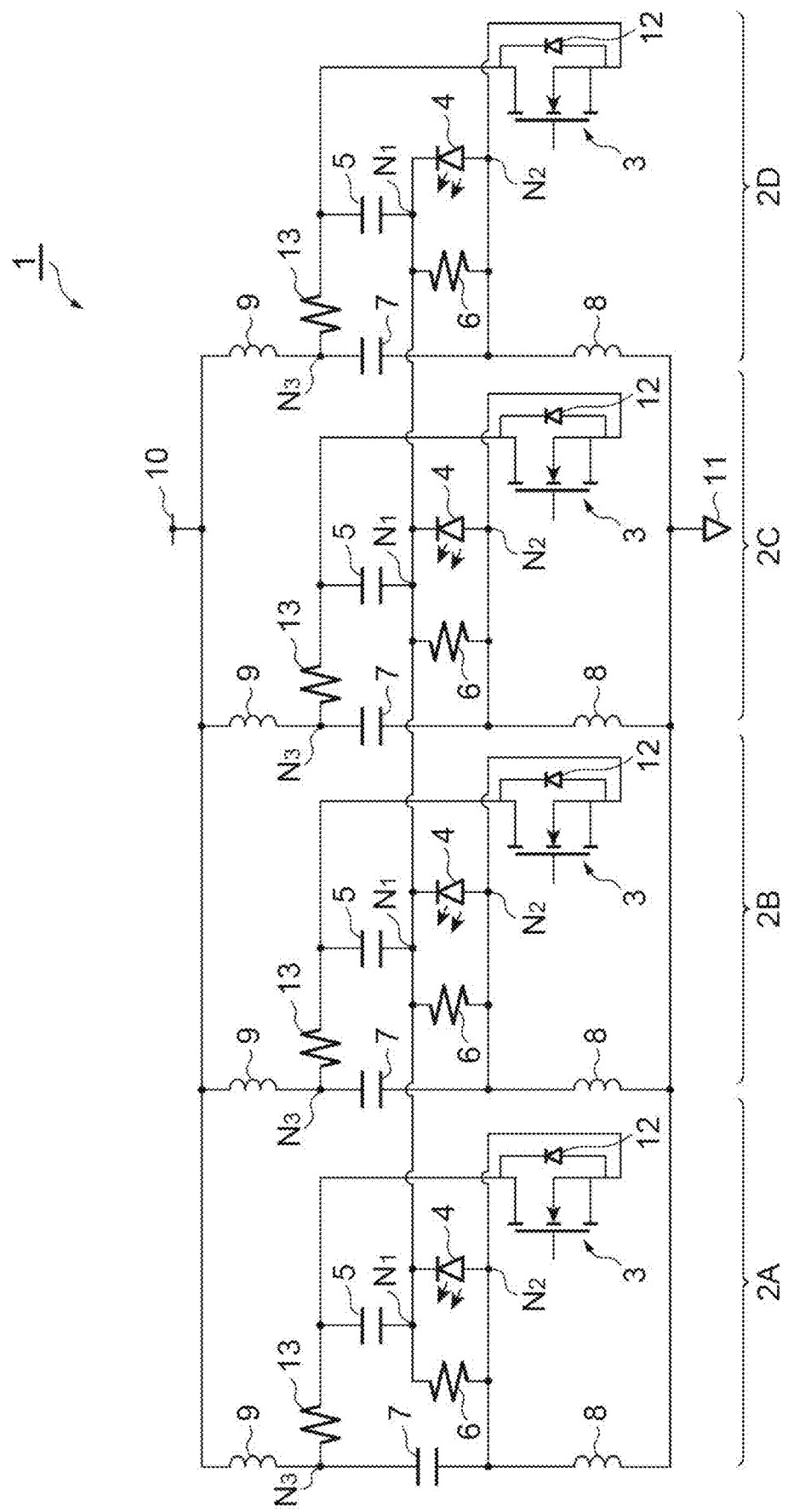
FIG. 1 is a circuit diagram illustrating a configuration of a light-emitting element driving circuit 1 according to an embodiment of the present disclosure.

First, the contents of embodiments of the present invention will be individually listed and described.

(1) A light-emitting element driving circuit according to the present embodiment is a circuit configured, as one aspect, to individually perform drive control of a plurality of semiconductor light-emitting elements, and includes a plurality of driving circuit units associated one-to-one with the plurality of semiconductor light-emitting elements. The cathodes of the plurality of semiconductor light-emitting elements may be unified as a cathode electrode by a monolithic structure, or may be electrically connected via a common line and/or a common terminal. As a result, the cathodes of the plurality of semiconductor light-emitting elements are set to the same potential. The plurality of driving circuit units individually pulse-drives the associated semiconductor light-emitting elements. Each of the plurality of driving circuit units includes a current control element, a first energy storage element, and a switching device. The current control element has a first terminal electrically connected to the cathode of the associated semiconductor light-emitting element via a first node, and a second terminal electrically connected to an anode of the associated semiconductor light-emitting element via a second node. The current control element causes current to flow from the first node to the second node while the associated semiconductor light-emitting element is in the non-light-emitting state, and limits the current while the associated semiconductor light-emitting element is in the light-emitting state. The first energy storage element includes a first electrode electrically connected to the first node and a second electrode. The switching element includes a control terminal to which a control signal for driving the associated semiconductor light-emitting element is inputted, a first current terminal electrically connected to the second electrode of the first energy storage element, and a second current terminal electrically connected to the second node.

Further, in the light-emitting element driving circuit, each of second electrodes of the first energy storage elements in the plurality of driving circuit units is electrically connected to a first constant potential line. Each of second nodes in the plurality of driving circuit units is electrically connected to a second constant potential line via a first current interrupting element or directly. However, the first current interrupting element is disposed on the line between two adjacent second nodes and avoids a short circuit between the two adjacent second nodes. The second constant potential line is set to a lower potential than the first constant potential line. The control target of the first current interrupting element is at least a current with a specific frequency or a current in a specific period. The first current interrupting element interrupts or suppresses the control target. The first current interrupting element interrupts or suppresses current at least during a period in which the switching element is in an ON-state.

As described above, in the first energy storage element, the first electrode is electrically connected to the first node, and the second electrode is electrically connected to a first constant potential line (for example, positive power supply line). Further, a current control element is connected to the first node, and the current control element causes a current to flow from the first node to the second node when the semiconductor light-emitting element does not emit light. The second node is electrically connected to a second constant potential line (for example, a ground line) having a potential lower than that of the first constant potential line. Therefore, during the period in which the switching element of each of the driving circuit units is in the OFF-state (that is, the non-light emission period of the semiconductor light-emitting element), a current is supplied from the first constant potential line to the first energy storage element of each of the driving circuit units, and a charge is accumulated in the first energy storage element.

During a period in which the switching element of a certain driving circuit unit is in the ON-state, the charge accumulated in the first energy storage element of the driving circuit unit returns from the second electrode of the first energy storage element to the first electrode of the first energy storage element through the second node, the semiconductor light-emitting element, and the first node. As a result, the semiconductor light-emitting element corresponding to the driving circuit unit on a one-to-one basis emits light (is driven). At this time, since the current control element limits the current, the charge can flow to the semiconductor light-emitting element without bypassing. In addition, if the first current interrupting element is not provided, a part of the charge flows from the second node to the second node of another driving circuit unit, and return to the first energy storage element of the driving circuit unit through the semiconductor light-emitting element of the other driving circuit unit and the cathode of the semiconductor device. In this case, the semiconductor light-emitting element of the other driving circuit unit also emits light, and individual driving of the semiconductor light-emitting elements cannot be realized. On the other hand, in the light-emitting element driving circuit having the above-described structure, the first current interrupting element is interposed between two adjacent second nodes among the second nodes in the plurality of driving circuit units, and the two adjacent second nodes are not short-circuited. Therefore, flowing of a part of the charge from the second node to the second node in another driving circuit unit is interrupted or suppressed. As a result, it is possible to prevent the semiconductor light-emitting element of the other driving circuit unit from emitting light, thereby realizing individual driving.

(2) As one aspect of the present disclosure, each of the plurality of driving circuit units may further include a second current interrupting element arranged on the line between the first constant potential line and the second electrode of the first energy storage element. The control target of the second current interrupting element is at least a current with a specific frequency or a current in a specific period. The second current interrupting element is an element that interrupts or suppresses the control target. The second current interrupting element interrupts or suppresses a current at least during a period in which the switching element is in an ON-state. In this case, the current is prevented from flowing from the first constant potential line to the second node through the switching element during the period in which the switching element is in the ON-state (the increase in the potential of the second node can be suppressed). As a result, a potential difference (in one example, a gate-source voltage of the FET) between the control terminal of the switching element and the second current terminal is maintained (stable on/off operations in the switching element are enabled).

(3) As one aspect of the present disclosure, each of the plurality of driving circuit units may further include a second energy storage element having a first electrode electrically connected to a third node between the second electrode of the first energy storage element and the second current interrupting element, and a first electrode electrically connected to the second node. In this case, during the period in which the switching element of each of the driving circuit units is in the OFF-state (that is, the non-light emitting period of the semiconductor light-emitting element), a current is supplied from the first constant potential line to the second energy storage element of each of the driving circuit units, and a charge is accumulated in the second energy storage element. Then, after the semiconductor light-emitting element is caused to emit light and the charge in the first energy storage element are discharged, the first energy storage element can be instantaneously recharged with the charge accumulated in the second energy storage element regardless of the interruption or suppression of the current by the second current interrupting element.

(4) As one aspect of the present disclosure, the capacity of the second energy storage element is preferably larger than the capacity of the first energy storage element. In this case, for example, when the semiconductor light-emitting element is caused to emit light a plurality of times at short time intervals, the first energy storage element can be recharged every emission of light regardless of the interruption or suppression of the current by the second current interrupting element.

(5) As one aspect of the present disclosure, the first current interrupting element may include an inductor. In this case, the inductor functions as a low pass filter, and can interrupt or suppress a high frequency current in pulse driving. Therefore, it is possible to interrupt or suppress the current passing through when the switching element is turned on.

(6) As one aspect of the present disclosure, the current control element may include a resistance element. In this case, since the impedance of the current control element is higher than the forward impedance of the semiconductor light-emitting element, a current can be limited when the semiconductor light-emitting element emits light. In addition, since the impedance of the current control element is lower than the impedance in the reverse direction of the semiconductor light-emitting element, a current can flow when the semiconductor light-emitting element does not emit light.

(7) As one aspect of the present disclosure, the plurality of driving circuit units may individually drive the plurality of semiconductor light-emitting elements integrated on a common semiconductor substrate. As an example, a semiconductor layer including an active layer is provided on the semiconductor substrate, and a cathode electrode serving as a common cathode of the plurality of semiconductor light-emitting elements is provided on a back surface of the semiconductor layer. On the other hand, as anodes of the plurality of semiconductor light-emitting elements, a plurality of anode electrodes corresponding to the anodes of the plurality of semiconductor light-emitting elements are provided on the upper surface of the semiconductor layer. Alternatively, cathodes (cathode electrodes) of the plurality of semiconductor light-emitting elements may be electrically connected via a common line and/or a common terminal. Both of the configurations can reduce the size of the semiconductor substrate and contribute to downsizing of the light-emitting device.

As described above, the aspects listed in the section [Description of Embodiments of Present Invention] are applicable to all the remaining aspects or to all combinations of these remaining aspects.

Details of Embodiments of Present Invention

Hereinafter, a specific structure of a light-emitting element driving circuit according to the present embodiment will be described in detail with reference to the accompanying drawings. Note that the present invention is not limited to the following examples, but is intended to include all modifications indicated by the claims and having meanings equivalent to the claims and within the scope of the claims. The same elements illustrated in the drawings are given the same reference signs, and duplicate descriptions thereof will be omitted. In the following description, unless otherwise specified, the term "electrically connected" includes both the case of being connected by a conductive wire having substantially zero resistance and the case of being connected via an electronic component such as a resistance. In addition, short-circuiting means being connected to each other with substantially zero electric resistance.

FIG. 1 is a circuit diagram illustrating a configuration of a light-emitting element driving circuit 1 according to an embodiment of the present disclosure. As illustrated in FIG. 1, the light-emitting element driving circuit 1 includes a plurality of driving circuit units 2A to 2D. In the example of FIG. 1, four driving circuit units are illustrated. The driving circuit units 2A to 2D is a circuit that individually pulse-drive a plurality of semiconductor light-emitting elements 4 (hereinafter, simply referred to as light-emitting elements 4) having cathodes set to the same potential. In the example of FIG. 1, four light-emitting elements are illustrated. The light-emitting elements 4 are, for example, laser diodes. The output wavelengths of the light-emitting elements 4 are included, for example, in the near-infrared range. In one example, the peak oscillation wavelength of each of the light-emitting element 4 is 905 nm, and the peak output of each of the light-emitting element 4 is, for example, 100 W. In this case, for example, a semiconductor light-emitting element array suitable for light detection and ranging (LiDAR) can be provided.

Figure 2:
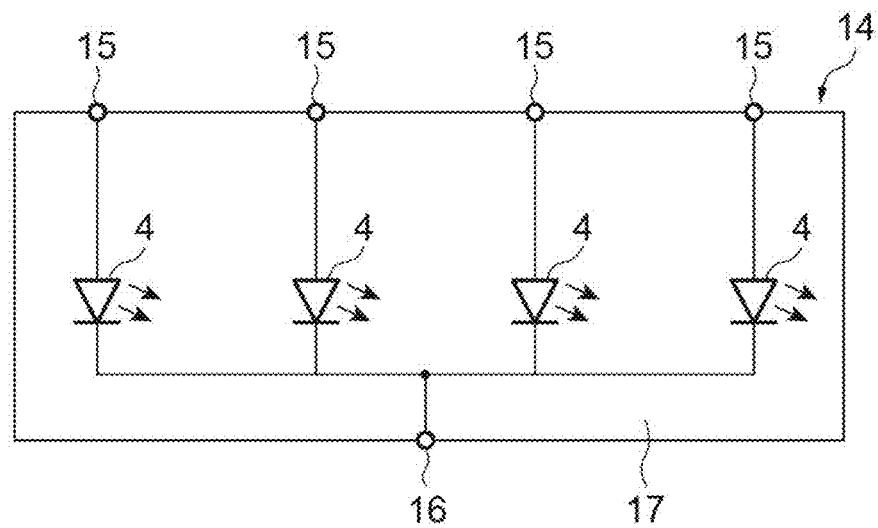
FIG. 2 is a schematic plan view of a semiconductor light-emitting element array 14.

FIG. 2 is a schematic plan view of a semiconductor light-emitting element array 14. The semiconductor light-emitting element array 14 has a monolithic structure in which the plurality of light-emitting elements 4 is integrated on a common semiconductor substrate 17. If the output wavelength is in the near-infrared range, the material of the semiconductor substrate 17 is, for example, GaAs or InP, and the material of the semiconductor layer provided on the semiconductor substrate 17 and including an active layer is, for example, AlGaAs, InGaAs, or InGaAsP. A cathode electrode (common cathode) used in common as cathodes of the plurality of light-emitting elements 4 is provided on a back surface of the semiconductor layer, and a plurality of anode electrodes separated from each other corresponding to anodes of the plurality of light-emitting elements 4 is provided on an upper surface of the semiconductor layer. The semiconductor light-emitting element array 14 includes a plurality of anode terminals 15 connected to the plurality of anode electrodes, and one cathode terminal 16 connected to the common cathode electrode.

Referring again to FIG. 1, the driving circuit units 2A to 2D have the same circuit configuration. Each of the driving circuit units 2A to 2D includes a transistor 3 (switching element), a capacitor 5 (first energy storage element), a current control element 6, a capacitor 7 (second energy storage element), a current interrupting element 8 (first current interrupting element), a current interrupting element 9 (second current interrupting element), and a resistance element 13.

The transistor 3 is an example of a switching element in the present embodiment, and is a selection unit for individually driving the light-emitting elements 4. The transistor 3 is, for example, a field effect transistor (FET). Hereinafter, a case where the transistor 3 is an enhancement type n-channel MOSFET will be exemplified, but the transistor 3 is not limited thereto. The transistor 3 is not limited to an FET, and may be, for example, a bipolar transistor. The transistor 3 has a control terminal and a pair of current terminals. If the transistor 3 is an FET, the control terminal is a gate, and the pair of current terminals is a source and a drain. If the transistor 3 is a bipolar transistor, the control terminal is a base, and the pair of current terminals is a collector and an emitter. FIG. 1 clearly illustrates parasitic diodes 12 included in the transistors 3.

The current control element 6 is connected in parallel with the light-emitting element 4 driven by a driving circuit to which the current control element 6 belongs. Specifically, the current control element 6 and the light-emitting element 4 are connected in parallel between a cathode-side node $N_1$ (first node) and an anode-side node $N_2$ (second node) of the light-emitting element 4. The current control element 6 causes a current to flow from the node $N_1$ to the node $N_2$ during the non-light emission period of the light-emitting element 4, and limits a current from the node $N_2$ to the node $N_1$ during the light emission period of the light-emitting element 4. The current control element 6 can include various electronic components, for example, such as resistance elements and diodes, individually or in combination. In the example of FIG. 1, resistance elements are illustrated as the current control elements 6. In this case, since the current direction from the node $N_1$ to the node $N_2$ is the opposite direction of the light-emitting element 4, a current flows through the resistance element, and since the current direction from the node $N_2$ to the node $N_1$ is the forward direction of the light-emitting element 4, a current flows through the light-emitting element 4. If the current control element 6 is a resistance element, its resistance value is, for example, 5Ω or more to 1 kΩ or less. If the current control element 6 is a diode, the connection direction of the diode is opposite to that of the light-emitting element 4 (the node $N_1$ is on the anode side, and node $N_2$ is on the cathode side). The smaller the resistance value of the current control element 6 is, the higher the rate of storage in the capacitor 5 described later can be.

The capacitor 5 is, for example, a chip capacitor mounted on a circuit board. The capacitor 5 has a pair of electrodes and accumulates a charge between the pair of electrodes. The capacitance value of the capacitor 5 is, for example, 500 pF or more to 1500 pF or less. The capacitance value of the capacitor 5 affects the peak output and pulse width of the pulsed light outputted from the light-emitting element 4. As the capacitance value of the capacitor 5 increases, the peak output and pulse width of the pulsed light increase. One electrode of the capacitor 5 is electrically connected to the node $N_1$. The other electrode of the capacitor 5 is electrically connected to one current terminal (for example, a drain) of the transistor 3 in a state where the resistance value is substantially zero. The other current terminal (for example, a source) of the transistor 3 is electrically connected to the node $N_2$ in a state where the resistance value is substantially zero. The potential of the node $N_2$ is a reference potential of the voltage applied to the control terminal of the transistor 3 (the terminal to which the pulse signal for driving the light-emitting element 4 is inputted).

The other electrode of the capacitor 5 is electrically connected to a power supply line 10 (first constant potential line), via the resistance element 13 and the current interrupting element 9 connected in series with each other. The power supply line 10 is a positive-potential power supply line provided as a common line for the driving circuit units 2A to 2D. The power supply line 10 supplies a predetermined power supply voltage between the power supply line 10 and a reference potential line 11 (second constant potential line) having a potential lower than that of the power supply line 10. The reference potential line 11 is also provided as a common line for the driving circuit units 2A to 2D.

The current interrupting element 8 is electrically connected between the node $N_2$ and the reference potential line 11. Specifically, one end of the current interrupting element 8 is electrically connected to the node $N_2$, and the other end is electrically connected to the reference potential line 11. That is, adjacent nodes among the nodes $N_2$ of the driving circuit units 2A to 2D are electrically connected via the current interrupting element 8, but are not short-circuited. The nodes $N_2$ of the driving circuit units 2A to 2D are always electrically connected to the reference potential line 11 via the current interrupting elements 8. The resistance value between the node $N_2$ and the current interrupting element 8 and the resistance value between the current interrupting element 8 and the reference potential line 11 are substantially zero.

The current interrupting element 8 is an element that interrupts or suppresses at least a current with a specific frequency or a current in a specific period. Herein, the specific frequency refers to the frequency of the rise and fall of a pulse driving current, and the specific period refers to the period from the rise to the fall of a pulse driving current. That is, the current interrupting element 8 interrupts or suppresses a current at least during the period in which the transistor 3 is in the ON-state. Examples of the element that interrupts or suppresses a current with a specific frequency include an inductor such as a ferrite bead, a resistance element, and the like. Examples of the element for interrupting or suppressing a current in a specific period include a transistor. The current interrupting element 8 can include these electronic components individually or in combination. FIG. 1 illustrates a circuit including only inductors as the current interrupting elements 8. In that case, the current interrupting elements 8 function as low-pass filters.

The current interrupting element 9 is connected between the power supply line 10 and the above-described other electrode of the capacitor 5 (that is, the electrode on the power supply line 10 side). In other words, the other electrode of the capacitor 5 is electrically connected to the power supply line 10 via the current interrupting element 9. Similar to the current interrupting element 8, the current interrupting element 9 is an element that interrupts or suppresses a current at least with a specific frequency or in a specific period, and interrupts or suppresses a current at least when the transistor 3 is in the ON-state. Examples of the element that interrupts or suppresses a current with a specific frequency include an inductor, a resistance element, and the like. Examples of the element for interrupting or suppressing a current in a specific period include a transistor. The current interrupting element 9 can include these electronic components individually or in combination. FIG. 1 illustrates a circuit including only inductors as the current interrupting elements 9. In that case, the current interrupting elements 9 function as low-pass filters. If the current interrupting elements 8 and 9 are low-pass filters, their cutoff frequencies may be equal to each other or different from each other. If the current interrupting elements 8 and 9 are both inductors, their inductances may be equal to each other or different from each other.

The capacitor 7 is, for example, a chip capacitor mounted on a circuit board. The capacitor 7 has a pair of electrodes and accumulates a charge between the pair of electrodes. The capacitance value of the capacitor 7 is larger than the capacitance value of the capacitor 5, and is, for example, 0.1 µF or more. In other words, the capacitance value of the capacitor 7 is, for example, 100 times or more the capacitance value of the capacitor 5. One electrode of the capacitor 7 is electrically connected to the node $N_3$ (third node). The node $N_3$ is a node between the electrode of the capacitor 5 on the power supply line 10 side and the current interrupting element 9 (in the present embodiment, between the resistance element 13 and the current interrupting element 9). The other electrode of the capacitor 7 is electrically connected to the node $N_2$.

Figure 3:
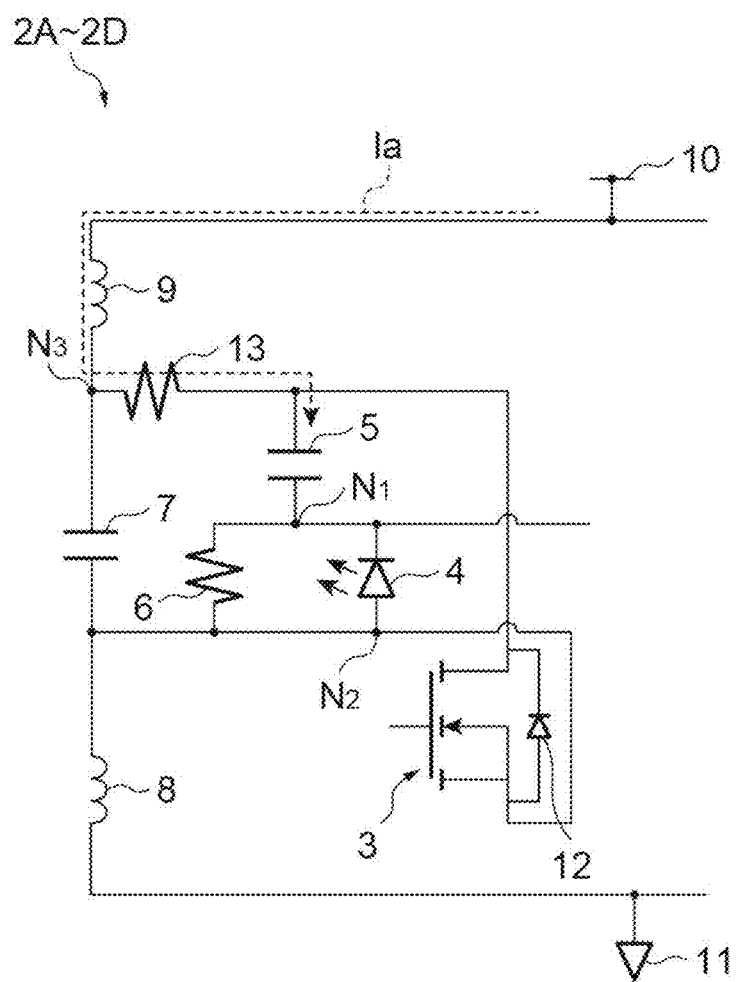
FIG. 3 is a diagram illustrating a current Ia flowing during a period in which a transistor 3 of each of driving circuit units 2A to 2D is in an OFF-state (that is, during non-light emission of a light-emitting element 4).

In the light-emitting element driving circuit 1 having the above structure, one electrode of the capacitor 5 is electrically connected to the node $N_1$, and the other electrode of the same is electrically connected to the power supply line 10. Further, the current control element 6 is connected to the node $N_1$, and the current control element 6 causes current to flow from the node $N_1$ to the node $N_2$ when the light-emitting element 4 does not emit light. The node $N_2$ is electrically connected to the reference potential line 11 having a potential lower than that of the power supply line 10. Therefore, during the period in which the transistors 3 of the driving circuit units 2A to 2D are in the OFF-state (that is, during non-light emission of the light-emitting element 4), the current Ia is supplied from the power supply line 10 to the capacitors 5 of the driving circuit units 2A to 2D, and charges are accumulated in the capacitors 5 as illustrated in FIG. 3.

Figure 4:
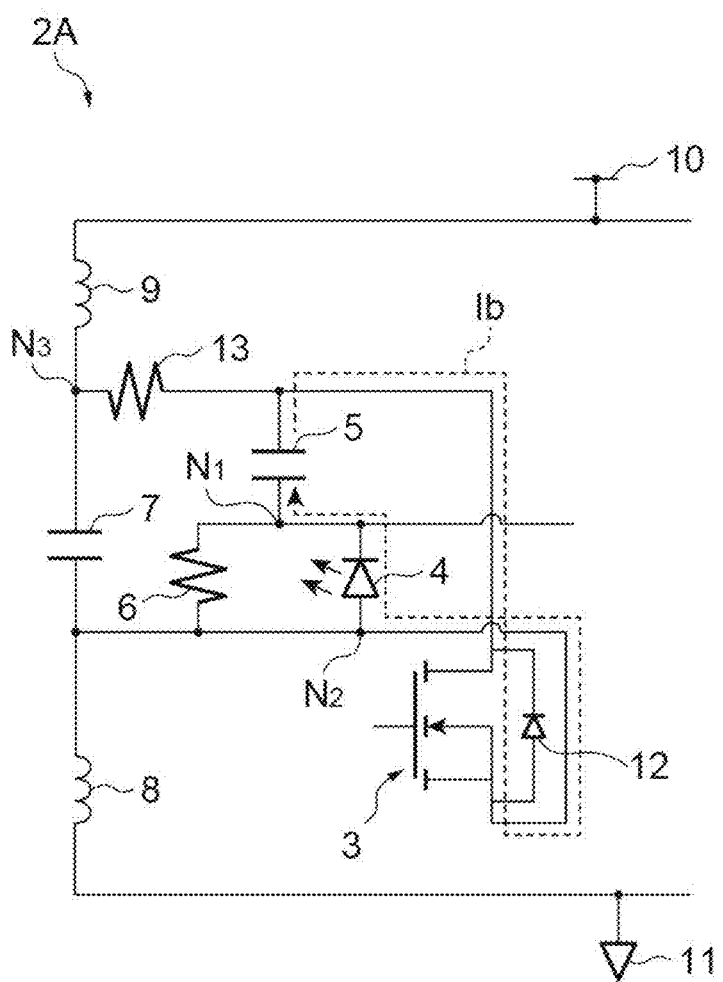
FIG. 4 is a diagram illustrating a driving current Ib flowing during a period in which the transistor 3 of the driving circuit unit 2A is in an ON-state.

Then, while the transistor 3 of a certain driving circuit unit (hereinafter, the driving circuit unit 2A will be taken in the description) is in the ON-state, the charge accumulated in the capacitor 5 of the driving circuit unit 2A instantaneously flows as the driving current Ib from the electrode of the capacitor 5 on the power supply line 10 side through the transistor 3, the node $N_2$, the light-emitting element 4, and the node $N_1$, and returns to the electrode of the capacitor 5 on the opposite side as illustrated in FIG. 4. Thus, the light-emitting element 4 of the driving circuit unit 2A is pulse-driven to emit light. At this time, since the current control element 6 limits the current, the driving current Ib can flow to the light-emitting element 4 without bypassing. The resistance element 13 inhibits the charge accumulated in the capacitor 7 from flowing to the transistor 3. Note that similar operation is possible in any of the driving circuit units 2B, 2C, and 2D.

Figure 5:
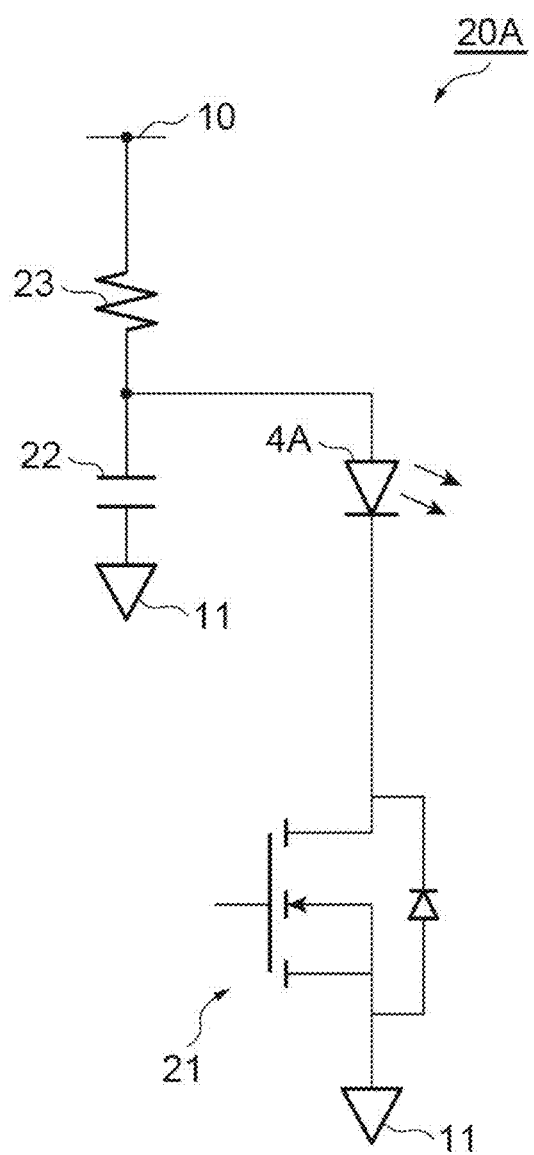
FIG. 5 is a circuit diagram illustrating a configuration of a light-emitting element driving circuit unit 20A according to a first comparative example.

Here, operational effects obtained by the light-emitting element driving circuit 1 according to the present embodiment will now be described together with comparative examples. FIG. 5 is a circuit diagram illustrating a configuration of a driving circuit 20A according to a first comparative example. The driving circuit 20A is a circuit for driving a single light-emitting element 4A, and includes a transistor 21 connected in series between a cathode of the light-emitting element 4A and the reference potential line 11, and a resistance element 23 and a capacitor 22 connected in series between the power supply line 10 and the reference potential line 11 and connected in series with each other. An anode of the light-emitting element 4 is connected to a node between the resistance element 23 and the capacitor 22.

In the driving circuit 20A, during a period in which the transistor 21 is in the OFF-state, current from the power supply line 10 is supplied to the capacitor 22, and a charge is accumulated in the capacitor 22. Then, when the transistor 21 is turned on, the charge accumulated in the capacitor 22 instantaneously flow to the reference potential line 11 through the light-emitting element 4A and the transistor 21. Thus, the light-emitting element 4A is pulse-driven to emit light.

Figure 6:
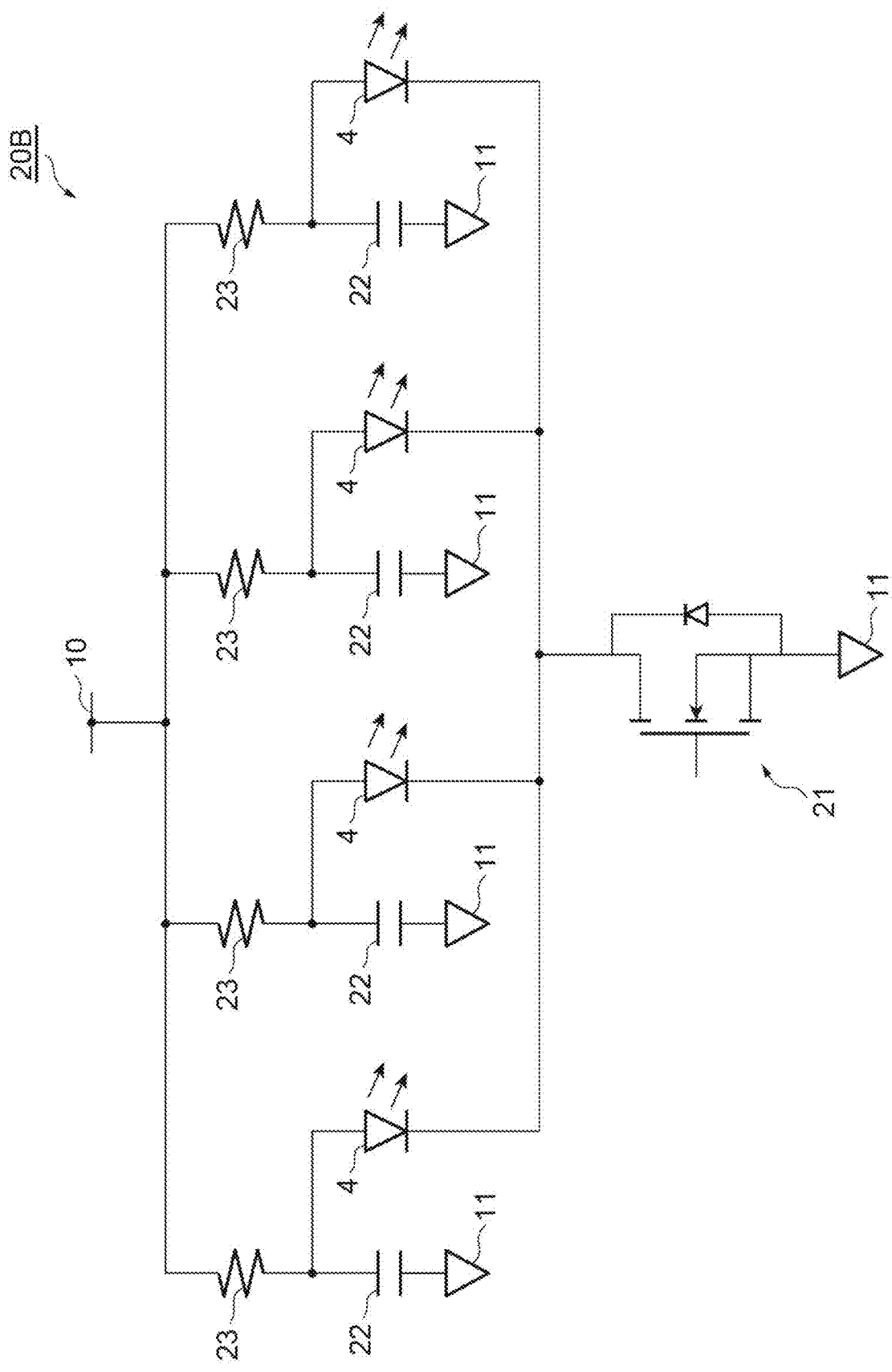
FIG. 6 is a circuit diagram illustrating a configuration of a light-emitting element driving circuit unit 20B according to a second comparative example.

FIG. 6 is a circuit diagram illustrating a configuration of a driving circuit 20B according to a second comparative example for driving four light-emitting elements 4 each having a cathode, the four cathodes being electrically connected to each other via a common line. The driving circuit 20B includes respective resistance elements 23 and capacitors 22 provided for the light-emitting elements 4, and a transistor 21 provided in common for the four light-emitting elements 4. A connection aspect between the light-emitting elements 4 and the resistance elements 23 and the capacitors 22 is similar to that in FIG. 5. The transistor 21 is connected in series between the common cathode of the four light-emitting elements 4 and the reference potential line 11. The power supply line 10 is in common for the light-emitting elements 4.

In the driving circuit 20B, during a period in which the transistor 21 is in the OFF-state, current from the power supply line 10 is supplied to the capacitors 22, and charges are accumulated in the capacitors 22. Then, when the transistor 21 is turned on, the charges accumulated in the capacitors 22 instantaneously flow to the reference potential line 11 through the light-emitting elements 4A and the transistors 21. Thus, the four light-emitting elements 4A are concurrently pulse-driven to emit light. Therefore, the four light-emitting elements 4 cannot be individually driven in the driving circuit 20B.

Figure 7:
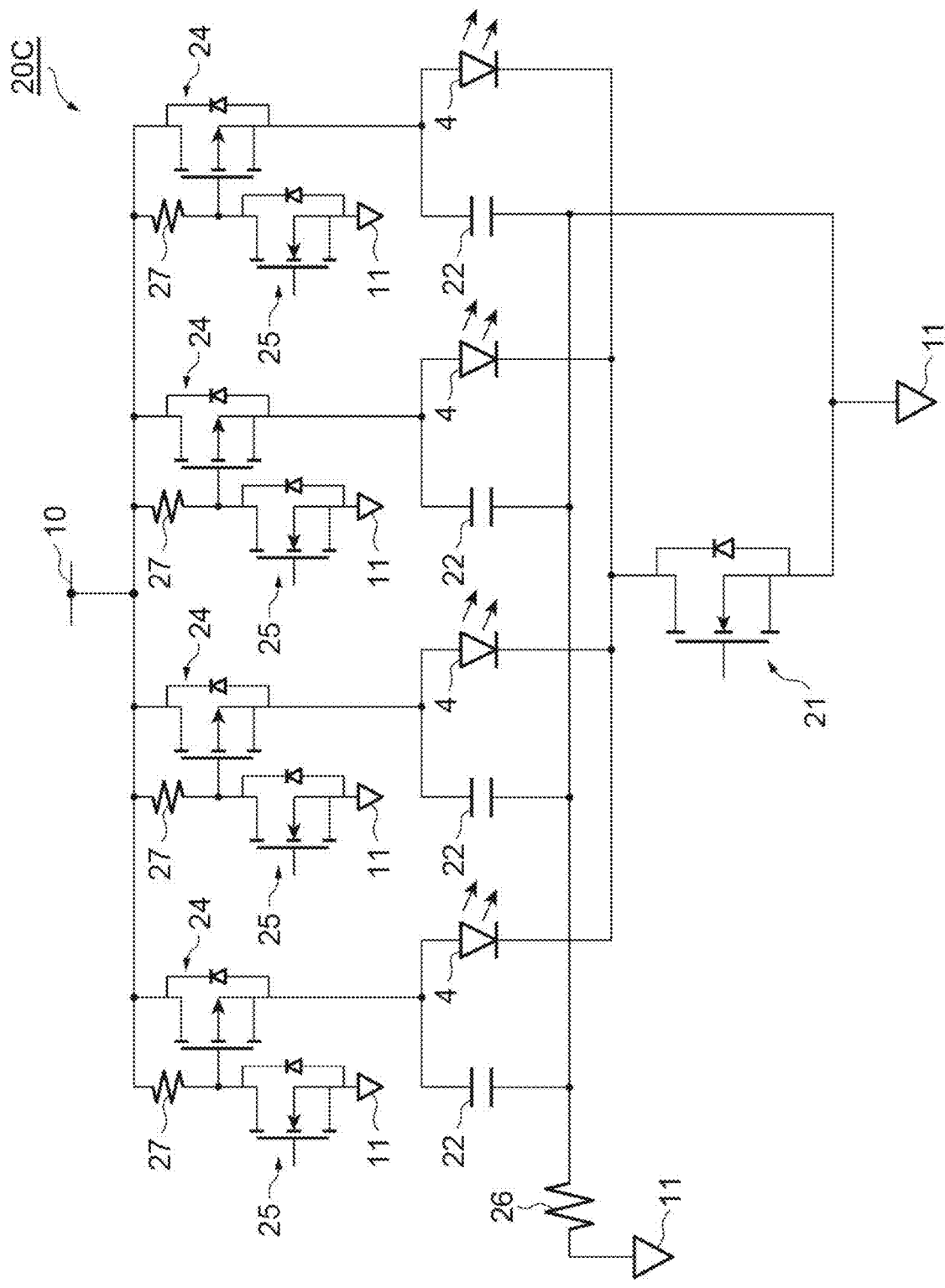
FIG. 7 is a circuit diagram illustrating a configuration of a light-emitting element driving circuit unit 20C according to a third comparative example.

Thus, an improvement for individually driving four light-emitting elements 4 having cathodes electrically connected via a common line, will be examined. FIG. 7 is a circuit diagram illustrating a driving circuit 20C according to an improved third comparative example. The driving circuit 20C further includes four transistors 24, four transistors 25, and a resistance element 26 in addition to the composition of the driving circuit 20B illustrated in FIG. 6.

The transistors 24 and 25 constitute switching circuits provided for each of the light-emitting elements 4. The transistor 24 is connected in series between the common power supply line 10 and the capacitor 22 and the light-emitting element 4, and controls current supplied to the capacitor 22. The transistor 25 constitutes a series circuit with the resistance element 27, and one end of the series circuit on the resistance element 27 side is connected to the power supply line 10 and the other end of the same is connected to the reference potential line 11. A node between the transistor 25 and the resistance element 27 is connected to a control terminal of the transistor 24, and a potential (driving control signal) of the node is applied to the control terminal of the transistor 24. That is, the transistor 25 is switched between ON- and OFF-states corresponding to ON- and OFF-states of the transistor 24. The transistors 24 are, for example, p-channel MOSFETs, and the transistors 25 are, for example, n-channel MOSFETs. According to this configuration, a high-withstand-voltage switching circuit can be constituted. The resistance element 26 is connected in series between the four capacitors 22 and the common reference potential line 11.

In the driving circuit 20C, first, in order to accumulate charges in the capacitor 22 corresponding to the light-emitting element 4 to be caused to emit light, the transistor 25 corresponding to the light-emitting element 4 is turned on. Accordingly, the transistor 24 corresponding to the light-emitting element 4 is turned on, and charges are accumulated in the capacitor 22. Thereafter, when the transistor 21 is turned on, current is instantaneously supplied from the capacitor 22 to the light-emitting element 4, and the light-emitting element 4 is pulse-driven to emit light.

However, this driving circuit 20C has a problem described below. That is, when a charge is accumulated in the capacitor 22 corresponding to the light-emitting element 4 to be caused to emit light, the voltage between both ends of the capacitor 22 increases. During the period in which the transistor 21 is in the OFF-state, this voltage between the both ends is applied as a reverse bias to the cathodes of the other three light-emitting elements 4 via the light-emitting element 4, and a reverse current having a magnitude proportional to this reverse bias flows through the light-emitting elements 4 and is supplied to the other three capacitors 22. As a result, charges are also accumulated in the other three capacitors 22. Therefore, when the transistor 21 is turned on, current is instantaneously supplied from the capacitors 22 to the light-emitting elements 4, and the four light-emitting elements 4 are simultaneously pulse-driven to emit light. That is, even in this driving circuit 20C, it is difficult to individually drive the four light-emitting elements 4.

Figure 8:
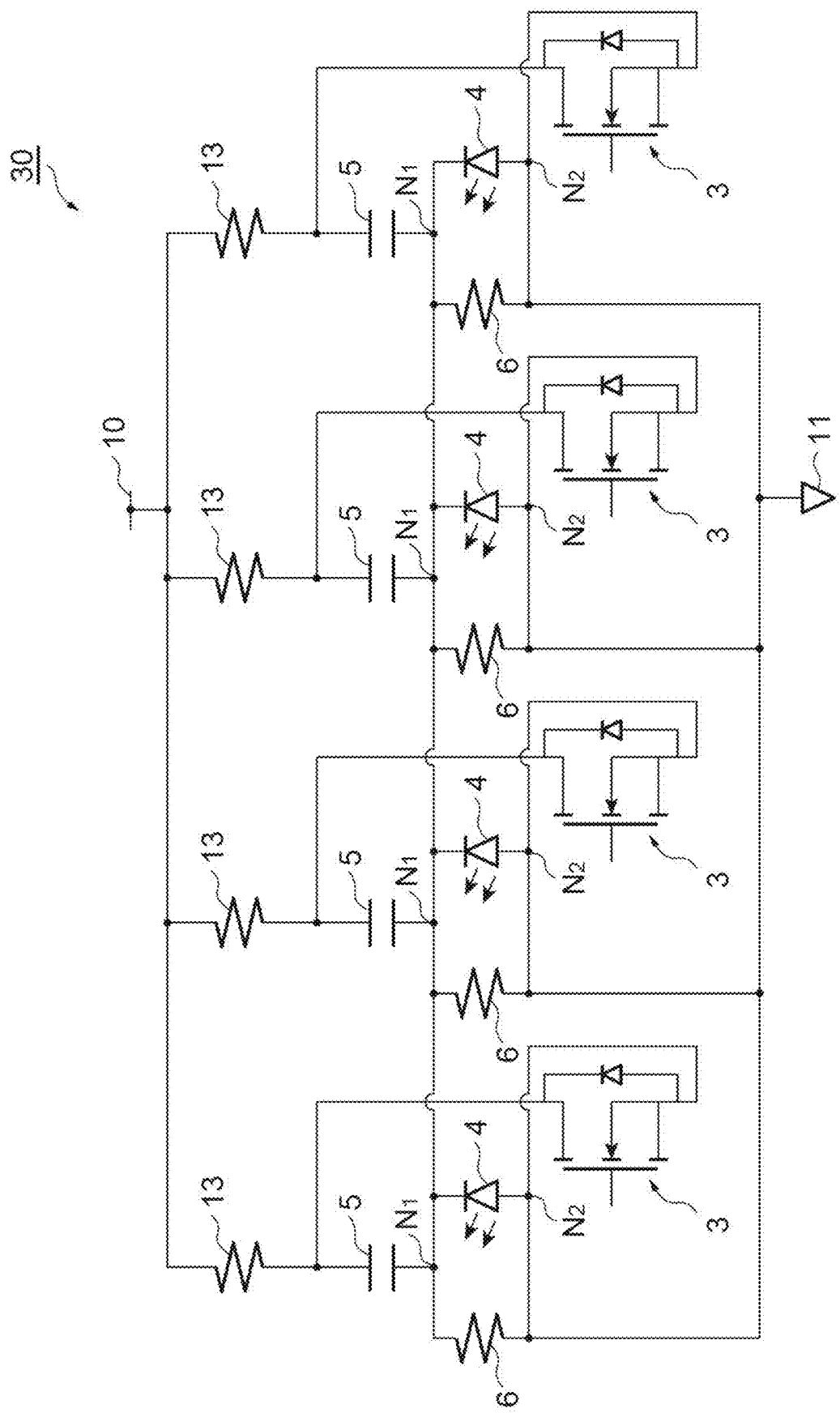
FIG. 8 is a circuit diagram illustrating a configuration of a light-emitting element driving circuit unit 30 according to a fourth comparative example.

Therefore, the present inventors have further studied a circuit for individually driving four light-emitting elements 4 having cathodes electrically connected via a common line. FIG. 8 is a circuit diagram illustrating a driving circuit 30 according to a fourth comparative example. The driving circuit 30 includes respective transistors 3, capacitors 5, and current control elements 6 provided for light-emitting elements 4. Note that the interconnection relationship among the transistors 3, the capacitors 5, and the current control elements 6 is similar to that of the present embodiment illustrated in FIG. 1. However, in the driving circuit 30, the electrode of each of the capacitors 5 on the power supply line 10 side is connected to a common power supply line 10 via only a resistance element 13, and a node $N_2$ is short-circuited to a reference potential line 11. In addition, capacitors 7 (see FIG. 1) are not provided.

Figure 9:
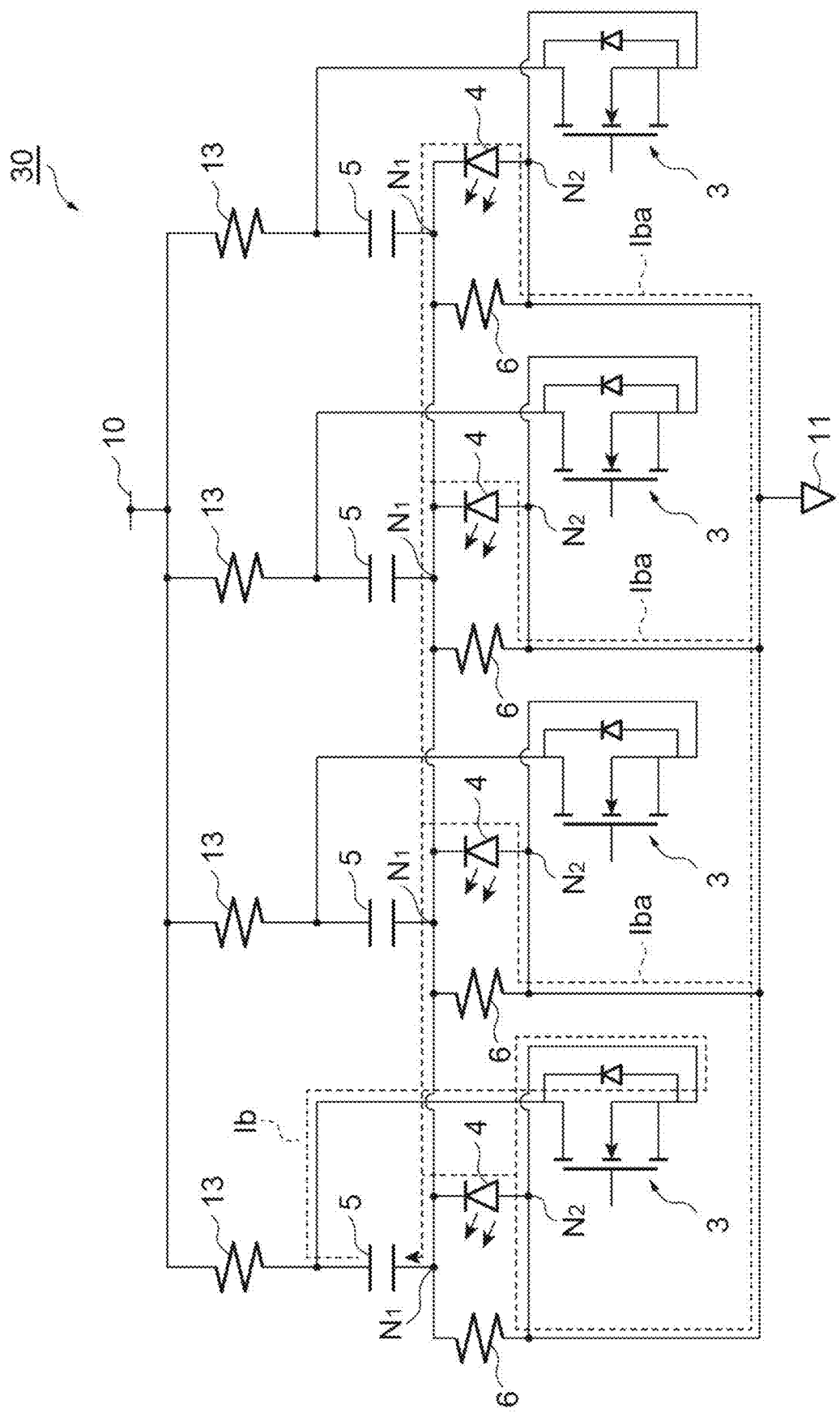
FIG. 9 is a diagram illustrating a current flowing during a period in which a certain transistor 3 is in an ON-state in the circuit illustrated in FIG. 8.

In the driving circuit 30, during a period in which the transistors 3 are in an OFF-state (that is, during a non-light emitting period of the light-emitting elements 4), current is supplied from the power supply line 10 to the capacitors 5 and charges are accumulated in the capacitors 5. Then, when a certain transistor 3 (for example, the left-end transistor 3) is turned on, the charge accumulated in the capacitor 5 connected to the transistor 3 instantaneously flows as a driving current Ib through the transistor 3, the node $N_2$, the light-emitting element 4, and a node $N_1$, and returns to the capacitor 5 as illustrated in FIG. 9. Thus, the light-emitting element 4A is pulse-driven to emit light. At this time, since the current control element 6 limits the current, the driving current Ib can flow to the light-emitting element 4 without bypassing.

However, as illustrated in FIG. 9, a part Iba of the driving current Ib flows from the node $N_2$ to the node $N_2$ of another light-emitting element 4, and returns to the original capacitor 5 through the other light-emitting element 4 and the common cathode. In this case, the other light-emitting element 4 also emits light, and thus individual driving of the light-emitting elements 4 cannot be realized.

On the other hand, in the light-emitting element driving circuit 1 of the present embodiment illustrated in FIG. 1, the current interrupting elements 8 are interposed between the nodes $N_2$ of the driving circuit units 2A to 2D, and the nodes $N_2$ of the driving circuit units 2A to 2D are not short-circuited to each other. The current interrupting element 8 is an element that interrupts or suppresses a current at least with a specific frequency or in a specific period, and interrupts or suppresses the current at least in a period during which the transistor 3 is in the ON-state. Therefore, flowing of a part of the driving current Ib from the node $N_2$ to the node N₂ of another driving circuit is interrupted or suppressed, and the light-emitting element 4 of the other driving circuit can be prevented from emitting light, thereby implementing individual driving.

Further, as in the present embodiment, each of the driving circuit units 2A to 2D may have a current interrupting element 9 connected between the common power supply line 10 and the electrode of the capacitor 5 on the power supply line 10 side. Similar to the current interrupting element 8, the current interrupting element 9 is an element that interrupts or suppresses a current at least with a specific frequency or in a specific period, and interrupts or suppresses a current at least in a period during which the transistor 3 is in the ON-state. In this case, when the transistor 3 is in the ON-state, current is prevented from flowing from the power supply line 10 to the node $N_2$ through the transistor 3. Therefore, it is possible to suppress an increase in the potential of the node $N_2$ caused by the current passing through the current interrupting element 8. As a result, a potential difference (gate-source voltage) between the control terminal (for example, the gate) and the other current terminal (for example, the source) of the transistor 3 is maintained, so that the transistor 3 can be stably switched on and off.

As in the present embodiment, each of the driving circuit units 2A to 2D may include a capacitor 7 as a bypass capacitor in which one electrode is connected to a node $N_3$ between the electrode of the capacitor 5 on the power supply line 10 side and the current interrupting element 9, and the other electrode is connected to the node $N_2$. In the driving circuit 30, when the transistor 3 is in the OFF-state (that is, during a non-light emitting period of the light-emitting element 4), current is supplied from the power supply line 10 to the capacitor 7 and a charge is accumulated in the capacitor 7. Then, after the semiconductor light-emitting element 4 is caused to emit light and the charge in the capacitor 5 is discharged, the capacitor 5 can be instantaneously recharged with the charge accumulated in the capacitor 7 regardless of the interruption or suppression of the current by the current interrupting element 9. Therefore, the light-emitting element 4 can be caused to emit light again in a short time, thereby allowing high-speed driving of the light-emitting elements 4.

Figure 10:
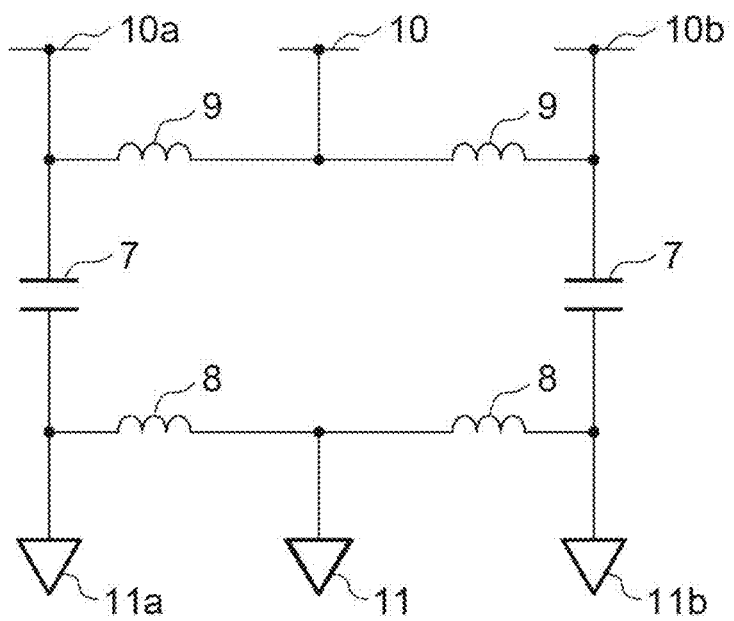
FIG. 10 is a circuit diagram conceptually illustrating a power supply system included in the light-emitting element driving circuit 1 in one embodiment.

FIG. 10 is a circuit diagram conceptually illustrating a power supply system included in the light-emitting element driving circuit 1 in the present embodiment. For simplification of description, FIG. 10 illustrates respective capacitors 7, inductors as the current interrupting elements 8, and inductors as the current interrupting elements 9 of the two driving circuit units 2A and 2B among the driving circuit units 2A to 2D. FIG. 10 also illustrates the common power supply line 10 and the common reference potential line 11. In the light-emitting element driving circuit 1, a filter circuit is constituted by the plurality of inductors constituting the current interrupting elements 8 and 9, and respective power supply systems of the driving circuit units 2A and 2B are virtually separated from each other by the filter circuit. FIG. 10 illustrates a virtual power supply line 10a and a reference potential line 11a that supply a power supply voltage to the driving circuit unit 2A, and a virtual power supply line 10b and a reference potential line 11b that supply a power supply voltage to the driving circuit unit 2B.

In this filter circuit, each inductor functions as a low-pass filter that interrupts a high frequency range including the rising and falling frequencies of a pulse driving current. The capacitors 7 function as bypass capacitors for reducing a power source impedance (impedance on the power source side as viewed from the point to which the load is connected) at the frequencies.

Figure 11:
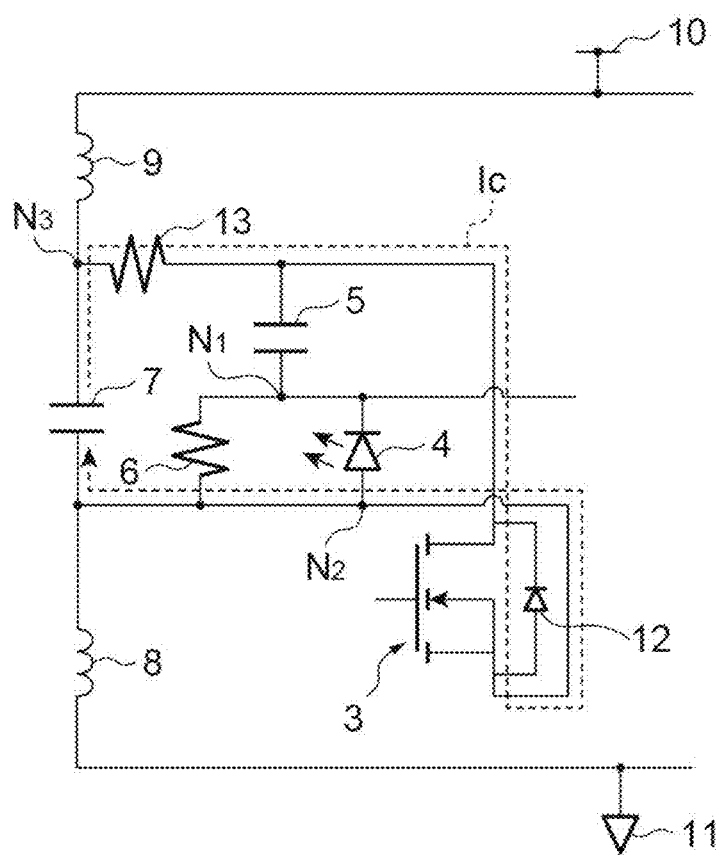
FIG. 11 is a diagram illustrating a current path from the capacitor 7 during a period in which the transistor 3 is in the ON-state (that is, during light emission period of the light-emitting element 4).

FIG. 11 is a diagram illustrating a current path from the capacitor 7 during a period in which the transistor 3 is in the ON-state (that is, during light emission period of the light-emitting element 4). As illustrated in FIG. 11, the current Ic outputted from the electrode of the capacitor 7 on the power supply line 10 side passes through the transistor 3 and then returns to the electrode of the capacitor 7 on the reference potential line 11 side via the node $N_2$. As above, at the time of light emission of the light-emitting element 4, all the current Ic outputted from the capacitor 7 returns to the capacitor 7 and does not go to the current interrupting element 8, and thus, does not cause an increase in the potential of the node $N_2$.

Figure 12:
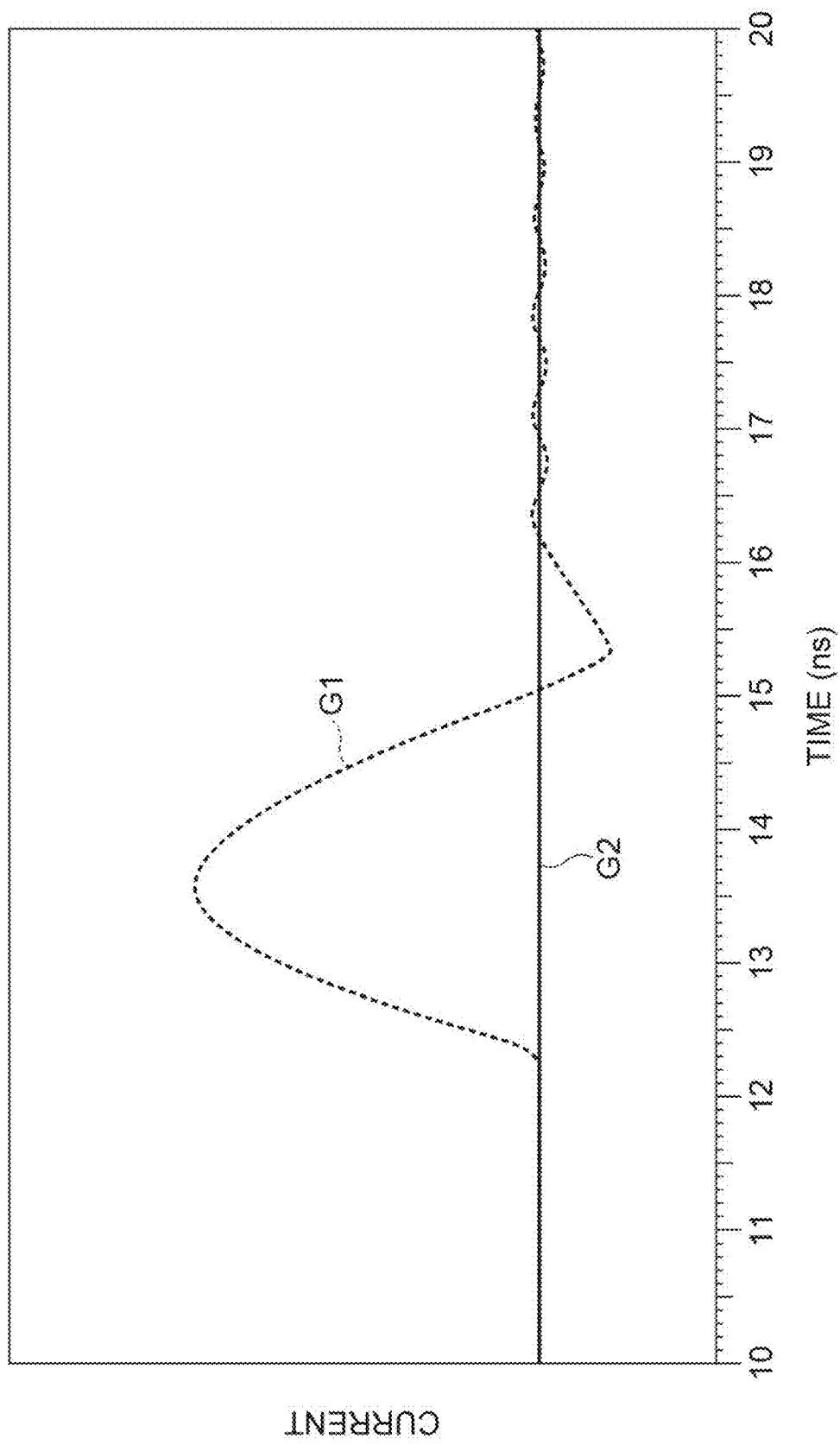
FIG. 12 is a graph illustrating simulation results of the operation of the light-emitting element driving circuit that individually drives two light-emitting elements 4 (that is, includes only the driving circuit units 2A and 2B).

FIG. 12 is a graph illustrating simulation results of the operation of the light-emitting element driving circuit that individually drives two light-emitting elements 4 (that is, includes only the driving circuit units 2A and 2B). In this simulation, one light-emitting element 4 was caused to emit light, and during that time, the other light-emitting element 4 was kept in an extinction state. In FIG. 12, the horizontal axis represents time (unit: nanosecond), and the vertical axis represents the magnitudes of current flowing through the light-emitting elements 4. As illustrated in FIG. 12, it can be seen that the current (graph G1) of one light-emitting element 4 changes in a pulse shape, and the pulse driving current Ib is supplied to the one light-emitting element 4. It can also be seen that the current (graph G2) of the other light-emitting element 4 does not change at all, and the pulse driving current Ib is hardly supplied to the other light-emitting element 4. That is, according to the light-emitting element driving circuit 1 of the present embodiment, the ratio (Pb/Pa) between a light output Pa of the light-emitting element 4 that is caused to emit light and a light output Pb of the light-emitting element 4 that is not caused to emit light can be made extremely small.

Figure 13:
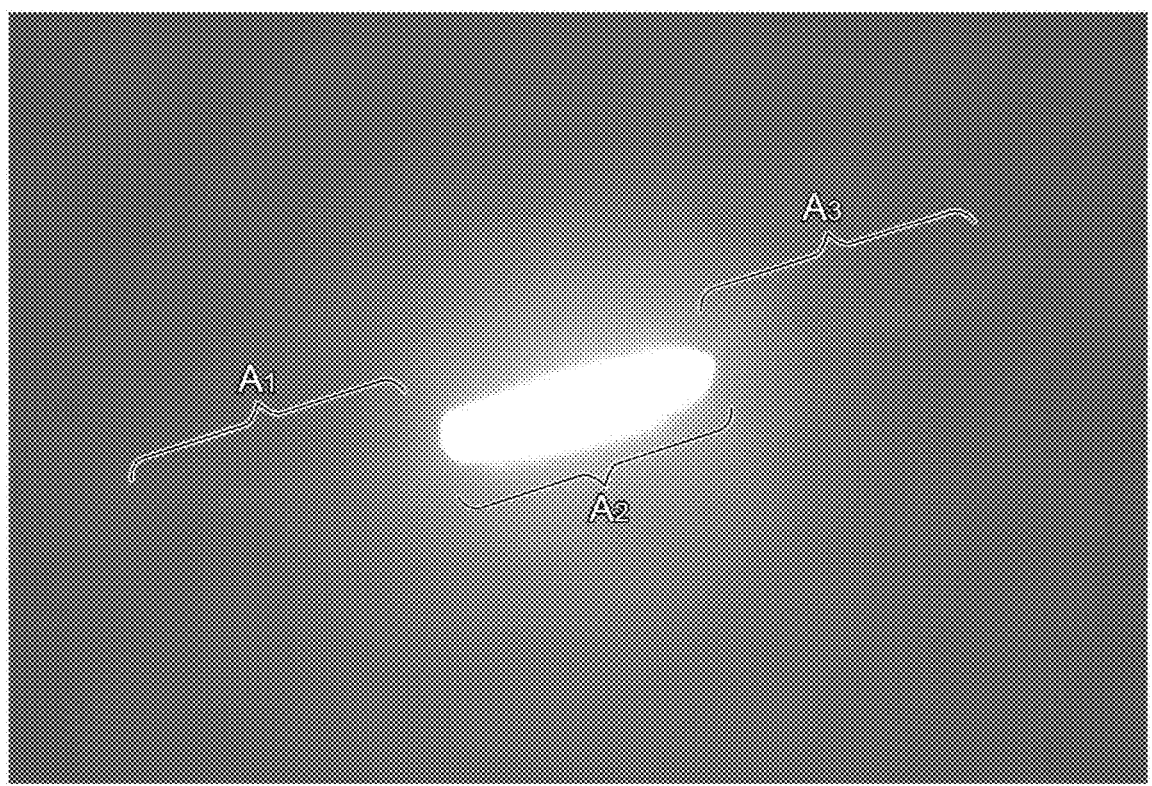
FIG. 13 is an image obtained by capturing a state of light emission in a light-emitting element driving circuit that has been actually manufactured as the light-emitting element driving circuit 1 in one embodiment that individually drives four light-emitting elements 4.

FIG. 13 is an image obtained by capturing a state of light emission in a light-emitting element driving circuit that has been actually manufactured as the light-emitting element driving circuit 1 in the present embodiment that individually drives four light-emitting elements 4. FIG. 13 illustrates a region $A_2$ corresponding to one light-emitting element 4 that emits light and regions $A_1$ and $A_3$ corresponding to two light-emitting elements 4 that are adjacent to both sides of the region $A_2$ and do not emit light. As illustrated in FIG. 13, it can be seen that the degree of darkness of the regions $A_1$ and $A_3$ that do not emit light is extremely high as compared with the bright region $A_2$ that emits light.

As in the present embodiment, the capacitance of the capacitor 7 may be larger than the capacitance of the capacitor 5. In this case, for example, when the light-emitting element 4 is caused to emit light a plurality of times at short time intervals, the capacitor 5 can be recharged every emission of light regardless of the interruption or suppression of the current by the current interrupting element 9.

As in the present embodiment, the current interrupting element 8 may include an inductor. In this case, the inductor functions as a low pass filter, and can interrupt or suppress a high frequency current in pulse driving. Therefore, it is possible to interrupt or suppress the current from passing during the period in which the transistor 3 is in the ON-state.

As in the present embodiment, the current control element 6 may include a resistance element. In this case, since the impedance of the current control element 6 is higher than the forward impedance of the light-emitting element 4, current can be limited during the light emission period of the light-emitting element 4. In addition, since the impedance of the current control element 6 is lower than the reverse impedance of the light-emitting element 4, current can flow during the non-light emission period of the light-emitting element 4. This makes it easy to realize the current control element 6 that causes current to flow from the node $N_1$ to the node $N_2$ during the non-light emission period of the light-emitting element 4 and limits the current during the light emission period of the light-emitting element 4. In addition, appropriately selecting the resistance value of the resistance element (more preferably, together with the resistance value of the resistance element 13) makes it possible to control the speed at which a charge is accumulated in the capacitor 5.

As in the present embodiment, the plurality of light-emitting elements 4 may be integrated on a common semiconductor substrate 17. In this case, unifying the cathodes of the plurality of light-emitting elements 4 (using one cathode electrode as the cathodes of the plurality of light-emitting elements 4) can downsize the semiconductor substrate 17, thereby contributing to miniaturization of the light-emitting device.

Modification Example

Figure 14:
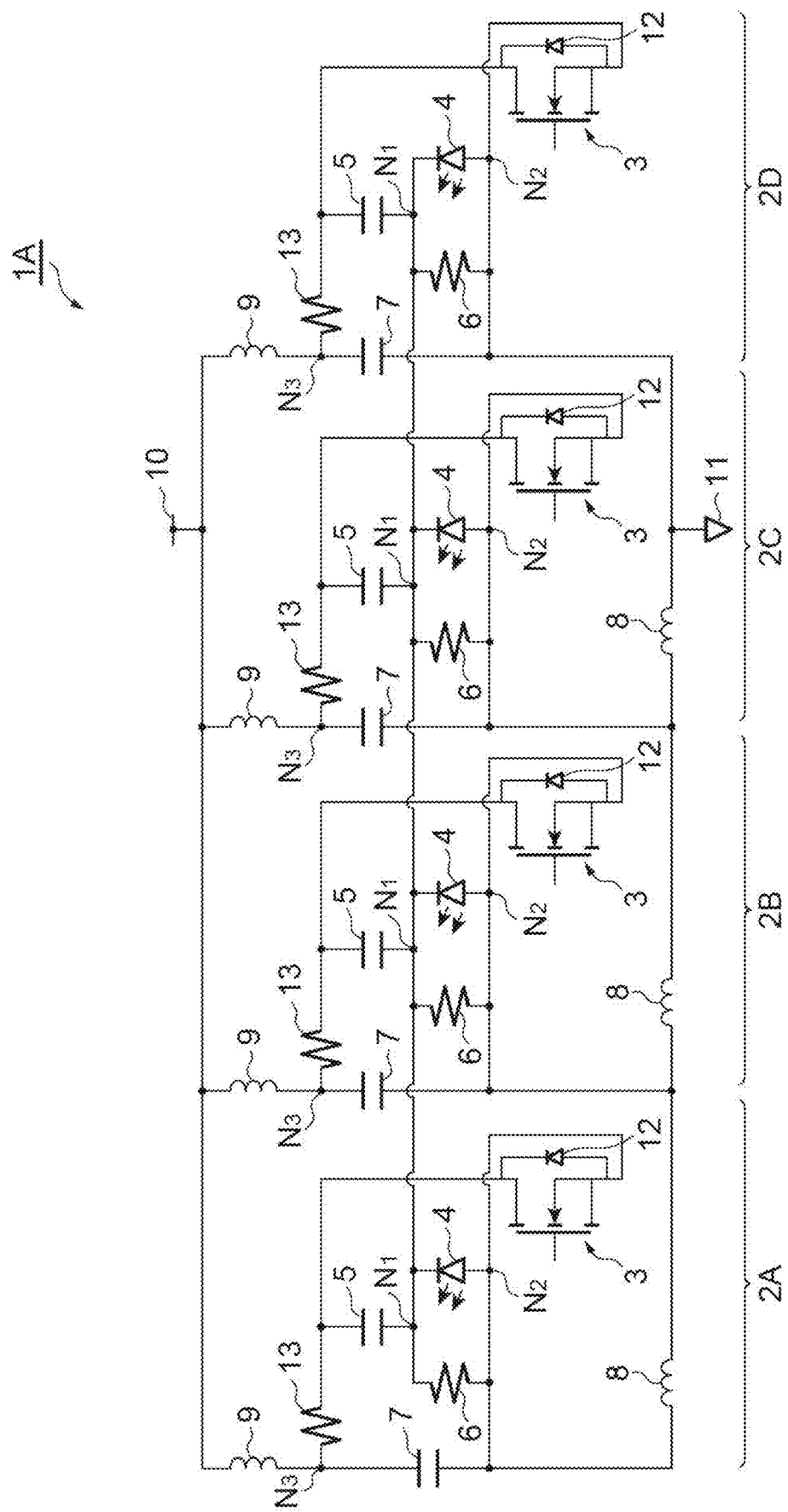
FIG. 14 is a circuit diagram illustrating a configuration of a light-emitting element driving circuit 1A according to a modification.

FIG. 14 is a circuit diagram illustrating a light-emitting element driving circuit 1A according to a modification example of the above embodiment. In this modification example, a node $N_2$ of one of driving circuit units 2A to 2D (for example, the driving circuit unit 2D) is electrically connected directly (with substantially zero resistance) to a reference potential line 11 without a current interrupting element 8. The nodes $N_2$ of the driving circuit units 2A to 2D are connected via the current interrupting elements 8 without short-circuiting each other. Therefore, the node $N_2$ of the driving circuit unit 2C is electrically connected to the reference potential line 11 via one current interrupting element 8, the node $N_2$ of the driving circuit unit 2B is electrically connected to the reference potential line 11 via two current interrupting elements 8, and the node $N_2$ of the driving circuit unit 2A is electrically connected to the reference potential line 11 via three current interrupting elements 8.

The connection aspect between the nodes $N_2$ of the driving circuit units 2A to 2D and the reference potential line 11 is not limited to the aspect illustrated in FIG. 1, and may be, for example, a aspect as in the present modification. Also, in the present modification example, the nodes $N_2$ of the driving circuit units 2A to 2D are connected to each other via the current interrupting elements 8 without short-circuiting each other, and are electrically connected to the reference potential line 11 via the current interrupting elements 8 or directly, so that the same advantageous effects as those of the above embodiment can be obtained.

The light-emitting element driving circuit of the present disclosure is not limited to the above-described embodiments and modification example, and various other modifications are possible. For example, FIG. 1 illustrates inductors as filters constituting the current interrupting elements 8 and 9. However, as filters constituting the current interrupting elements 8 and 9, for example, various other elements such as chip ferrite beads and RC filter circuits can be applied as long as they are low-pass filters or band-pass filters that interrupt or suppress an AC current of high frequencies (for example, GHz band) in pulse driving and pass a current of low frequencies (for example, DC to kHz band). In particular, the chip ferrite bead can be formed in a single chip for each driving circuit, so that the light-emitting element driving circuit 1 can be easily configured.

At least one of the current interrupting elements 8 and 9 is not necessarily a filter. As described above, the current interrupting elements 8 and 9 illustrated in FIG. 1 may include resistance elements instead of inductors (or in addition to inductors) as elements for interrupting or suppressing at least a current with a specific frequency. In particular, if the driving cycle of the light-emitting element 4 is relatively long, the current interrupting elements 8 and 9 may be constituted only by the resistance elements. In this case, one end of the resistance element as the current interrupting element 8 is electrically connected to the node $N_2$, and the other end of the same is electrically connected to the reference potential line 11. The other electrode of the capacitor 5 is electrically connected to the power supply line 10 via a resistance element as the current interrupting element 9. However, in this case, since the current is suppressed in all frequency bands, the power loss increases, and it takes time to recharge the capacitor 5. On the other hand, when the current interrupting elements 8 and 9 are constituted by filters, it is possible to reduce the power loss and shorten the time for recharging the capacitor 5.

As described above, at least one of the current interrupting elements 8 and 9 in FIG. 1 may include a switching element such as a transistor instead of the inductor (or in addition to the inductor) as an element for interrupting or suppressing a current in at least a specific period. In this case, the switching element may be turned off during a certain period including the period in which the transistor 3 is in the ON-state (that is, the light emission period of the light-emitting element 4), and the switching element may be turned on during other periods. Even in such a case, the same advantageous effects as those of the above embodiment can be obtained. However, switching elements as many as the number of driving circuits, a control circuit for driving these switching elements, and the like are further required. On the other hand, in a case where the current interrupting elements 8 and 9 are constituted by filters, a control circuit is not required, and the current interrupting elements 8 and 9 can be constituted at a lower cost than the switching elements, which is advantageous in terms of reduction in manufacturing cost and downsizing of the device.

Although FIG. 1 illustrates a case where each of the driving circuit units 2A to 2D drives one light-emitting element 4, each of the driving circuit units 2A to 2D may drive two or more light-emitting elements 4. In other words, the number of the light-emitting elements 4 may be larger than the number of the driving circuit units 2A to 2D. In that case, each of the light-emitting elements 4 illustrated in FIG. 1 is replaced with two or more light-emitting elements 4 connected in parallel or in series with each other.

REFERENCE SIGNS LIST 1, 1A . . . Light-emitting element driving circuit; 2A to 2D . . . Driving circuit unit; 3 . . . Transistor; 4, 4A . . . Light-emitting element (semiconductor light-emitting element); 5 . . . Capacitor (first energy storage element); 6 . . . Current control element; 7 . . . Capacitor (second energy storage element); 8 . . . Current interrupting element (first current interrupting element); 9 . . . Current interrupting element (second current interrupting element); 10 . . . Power supply line (first constant potential line); 10a, 10b . . . Virtual power supply line; 11 . . . Reference potential line (second constant potential line); 11a, 11b . . . Virtual reference potential line; 12 . . . Parasitic diode; 13 . . . Resistance element; 14 . . . Semiconductor light-emitting element array; 15 . . . Anode terminal; 16 . . . Cathode terminal; 17 . . . Semiconductor substrate; 20A, 20B, 20C . . . Driving circuit; 21 . . . Transistor; 22 . . . Capacitor; 23 . . . Resistance element; 24, 25 . . . Transistor; 26, 27 . . . Resistance element; 30 . . . Driving circuit; $N_1$ . . . Node (first node); $N_2$ . . . Node (second node); and $N_3$ . . . Node (third node).

The invention claimed is:

1. A light-emitting element driving circuit configured to individually perform drive control of a plurality of semiconductor light-emitting elements each having a cathode set to a same potential, the light-emitting element driving circuit comprising:

a plurality of driving circuit units provided in one-to-one correspondence with the plurality of semiconductor light-emitting elements and configured to individually drive the associated semiconductor light-emitting elements, wherein each of the plurality of driving circuit units includes:

a current control element having a first terminal electrically connected to the cathode of the associated semiconductor light-emitting element via a first node and a second terminal electrically connected to an anode of the associated semiconductor light-emitting element via a second node, the current control element being configured to cause current to flow from the first node to the second node during a period in which the associated semiconductor light-emitting element is in a non-light-emitting state, and to limit the current during a period in which the associated semiconductor light-emitting element is in a light-emitting state;

a first energy storage element having a first electrode electrically connected to the first node and a second electrode; and a switching element having a control terminal to which a control signal for driving the associated semiconductor light-emitting element is inputted, a first current terminal electrically connected to the second electrode of the first energy storage element, and a second current terminal electrically connected to the second node, wherein each of the second electrodes of the first energy storage elements in the plurality of driving circuit units is electrically connected to a first constant potential line, wherein each of the second nodes in the plurality of driving circuit units is electrically connected to a second constant potential line set to a lower potential than the first constant potential line via a first current interrupting element or directly, the first current interrupting element being arranged on a line between two second nodes adjacent to each other and being configured to avoid a short circuit between the two second nodes adjacent to each other, and wherein the first current interrupting element is an element configured to interrupt or suppress at least a current with a specific frequency or a current in a specific period, the first current interrupting element interrupting or suppressing at least the current during a period in which the switching element is in an ON-state.

2. The light-emitting element driving circuit according to claim 1, wherein each of the plurality of driving circuit units further includes a second current interrupting element arranged on a line between the first constant potential line and the second electrode of the first energy storage element, and the second current interrupting element is an element configured to interrupt or suppress at least a current with a specific frequency or a current in a specific period, the second current interrupting element interrupting or suppressing at least the current during the period in which the switching element is in the ON-state.

3. The light-emitting element driving circuit according to claim 2, wherein each of the plurality of driving circuit units further includes a second energy storage element having a first electrode electrically connected to a third node located on a line between the second electrode of the first energy storage element and the second current interrupting element; and a second electrode electrically connected to the second node.

4. The light-emitting element driving circuit according to claim 3, wherein a capacity of the second energy storage element is larger than a capacity of the first energy storage element.

5. The light-emitting element driving circuit according to claim 1, wherein the first current interrupting element includes an inductor.

6. The light-emitting element driving circuit according to claim 1, wherein the current control element includes a resistance element.

7. The light-emitting element driving circuit according to claim 1, wherein the plurality of driving circuit units individually drives the plurality of semiconductor light-emitting elements integrated on a common semiconductor substrate.

* * * * *